United States Patent [19]

Tsoi et al.

[11] Patent Number: 4,937,477
[45] Date of Patent: Jun. 26, 1990

[54] INTEGRATED MOS HIGH-VOLTAGE LEVEL-TRANSLATION CIRCUIT, STRUCTURE AND METHOD

[75] Inventors: Hak-Yam Tsoi, San Jose; Benedict C. K. Choy, Saratoga, both of Calif.

[73] Assignee: Supertex, Inc.

[21] Appl. No.: 149,853

[22] Filed: Jan. 19, 1988

[51] Int. Cl.$^5$ .................. H03K 19/017; H03K 19/003; H03K 19/094; H03K 17/687

[52] U.S. Cl. .................................... 307/475; 307/544; 307/548; 307/559; 307/568; 307/585

[58] Field of Search ................. 307/264, 200 B, 286.1, 307/296.5, 446, 302, 450, 451, 475, 270, 542, 548, 549, 568, 570, 576, 579, 585, 296.4, 559; 361/56, 90, 92

[56] References Cited

U.S. PATENT DOCUMENTS

| | | | |
|---|---|---|---|
| 3,407,339 | 10/1968 | Booher | 307/577 |
| 4,101,788 | 7/1978 | Baker | 307/269 |
| 4,191,898 | 3/1980 | Ulmer | 307/475 |
| 4,296,335 | 10/1981 | Simcoe | 307/296.4 |
| 4,305,009 | 12/1981 | Miyagawa et al. | 307/264 |
| 4,518,926 | 5/1985 | Swanson | 307/450 |
| 4,556,804 | 12/1985 | Dewitt | 307/585 |
| 4,578,600 | 3/1986 | Magee | 307/585 |
| 4,578,694 | 3/1986 | Auizumi et al. | 307/450 |
| 4,584,492 | 4/1986 | Sharp | 307/475 |
| 4,626,704 | 12/1986 | Takata et al. | 307/264 |
| 4,631,426 | 12/1986 | Nelson et al. | 307/473 |
| 4,743,782 | 5/1988 | Nelson et al. | 307/475 |
| 4,767,950 | 8/1988 | Schrenk | 307/450 |
| 4,810,969 | 3/1989 | Fulkerson | 307/548 |
| 4,812,863 | 3/1989 | Fitzpatrick et al. | 307/446 |
| 4,853,563 | 8/1989 | Hill et al. | 307/475 |
| 4,873,458 | 10/1989 | Yoshida | 307/296.1 |

FOREIGN PATENT DOCUMENTS

| | | | |
|---|---|---|---|
| 0013852 | 2/1978 | Japan | 307/475 |
| 0253314 | 12/1985 | Japan | 307/264 |

OTHER PUBLICATIONS

Fink et al "Electronics Engineers' Handbook" Second Edition-1982-McGraw-Hill-pp. 7-40; pp. 16-1-6-16.1g.

Primary Examiner—Andrew J. James
Assistant Examiner—Tai V. Duong
Attorney, Agent, or Firm—Harry M. Weiss

[57] ABSTRACT

A high-voltage level translator circuit is disclosed that is suitable for monolithic integration. The level translator circuit comprises serially-connected current sources suitably ratioed so that the gating on of one current source causes a limited voltage rise across the other current source, which is ungated. The circuit is suitable for integration in a junction-isolated monolithic pseudo-complementary CMOS format.

8 Claims, 1 Drawing Sheet

INTEGRATED MOS HIGH-VOLTAGE LEVEL-TRANSLATION CIRCUIT, STRUCTURE AND METHOD

BACKGROUND OF THE INVENTION

1. Field of the Invention

This invention generally relates to a high-voltage level-translation circuit structure and method, and more particularly, to a high-voltage level-translation circuit structure and method suitable for use in high-voltage MOS integrated circuit type applications.

2. Brief Description of the Prior Art

Complementary N and P channel MOS devices have been commonly used for active pull-up and pull-down operation in power driven circuitry. For supply voltages greater than about 50 volts, the P and N channel gates of the complementary driver devices are usually driven separately in order to avoid excessive gate voltages. This separate operation or excitation requires high-voltage level-shifting or level-translation circuitry to translate a ground-reference logic signal to a high-voltage reference logic signal to drive one of these push-pull devices. Discrete type level translation devices usually involve the additional use of an optoelectronic isolation, a resistor and zener voltage divider, or capacitive coupling circuitry. These approaches are either incompatible with silicon integrated circuitry, inefficient in using silicon real estate, or involve substantial performance trade-offs.

Thus, a need has existed to provide improved high-voltage level translation circuitry for drawing serially-connected high-voltage MOS transistors. In particular, a need has existed to provide high-voltage level-translation circuitry suitable for monolithic integration without substantial loss of performance.

SUMMARY OF THE INVENTION

In accordance with the preferred embodiments of this invention described hereinafter, it is an object of this invention to provide a high-voltage level-translation circuit, method and structure compatible for use with MOS semiconductor devices.

It is still another object of this invention is to provide a level-translation unit comprising MOS transistors for driving one of a pair of complementary MOS transistors serially connected across a high voltage supply.

It is yet another object of this invention to provide a high-voltage level-translation circuit capable of economical integration in a monolithic integrated circuit format.

In accordance with a preferred embodiment of this invention, there is provided a level-translation circuit and method comprising or providing first and second serially-connected current source devices. The second current source device may be switched on or off, while the first current source device is coupled to shunt means for limiting its voltage excursion when the second current source device is switched on. The second current source device has a greater current-carrying capability than the first current source device.

In accordance with another embodiment of this invention, an integrated high-voltage level-translation circuit comprising CMOS transistors is provided requiring a high-voltage device of only one conductivity type, resulting in or permitting relatively simple and inexpensive integration.

The foregoing and other objects, features, and advantages of this invention will be apparent from the following, more particular description of the preferred embodiments of this invention as illustrated in the accompanying drawings.

DETAILED DESCRIPTION OF THE INVENTION

Figure 1A:
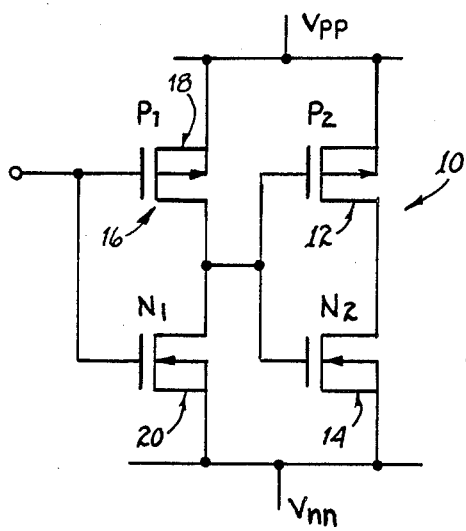
FIGS. 1a and 1b are, respectively, electrical schematic and block diagram illustrations of prior art power driver circuitry.

Referring now to FIG. 1a, there is shown a prior art CMOS circuit comprising an output driver inverter 10 comprising P-type ($P_2$) MOS transistor 12 and N type ($N_2$) MOS transistor 14 whose gates are connected together, whose drains are connected together and whose sources are connected, respectively, to $V_{pp}$ and $V_{nn}$. The output driven inverter 10 is driven by a pre-driver inverter 16 comprising a P type ($P_1$) MOS transistor 18 and an N type ($N_1$) MOS transistor 20. The source of the MOS transistors 18 and 20 are respectively connected to $V_{pp}$ and $V_{nn}$, their gates are connected together and to an input terminal, and their drains are connected together and are also connected to the gates of the MOS transistors 12 and 14. Substantially all the supply voltage $V_{pp}$ or $V_{nn}$ is impressed across the gate to source terminals of one or the other of the CMOS transistors in the output driver 10 (output driver inverter) depending on the state of the predriver inverter 16. This arrangement is thus only suitable for supply levels up to about the gate rupture voltage of the output driver CMOS transistors 12 and 14, or about 50 volts for typical devices.

Figure 1B:
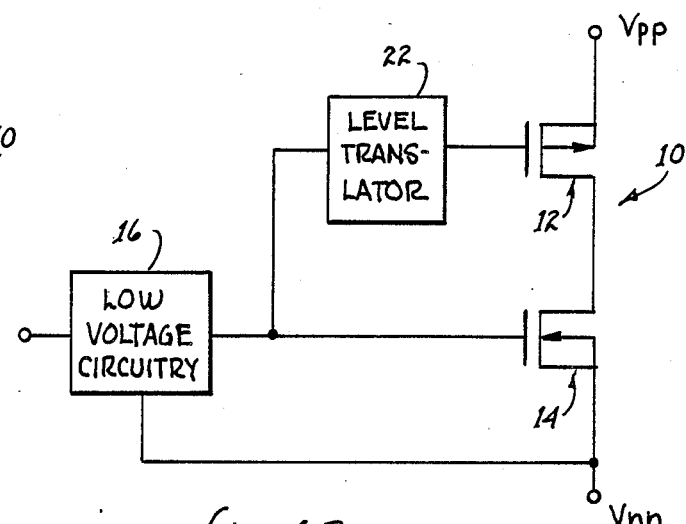

For higher voltages, the prior art has usually employed the block diagram and schematic circuitry of FIG. 1b. Here the output driver CMOS transistors 12 and 14 of the output driver 10 are connected between a first supply voltage $V_{pp}$ and a second supply voltage $V_{nn}$. The low voltage pre-driver circuit 16 comprising the complementary pair of MOS devices 18 and 20 which is referenced to $V_{nn}$ drives the N-channel MOS transistor 14 directly to provide a gate signal somewhat in excess of its threshold voltage. The gate of the P-channel transistor 12 is driven through a level translator 22 to provide a gate voltage drive referenced to $V_{pp}$ but which cannot swing sufficiently below $V_{pp}$ to rupture the gate of the P-channel transistor 12. In the past, level translation has been accomplished with an opto-isolator, a resistor and zener voltage divider, or a capacitive coupling circuit. These approaches are either incompatible with silicon integrated circuit technology or inefficient in using silicon area so that the cost of the translation function is excessive.

Figure 2:
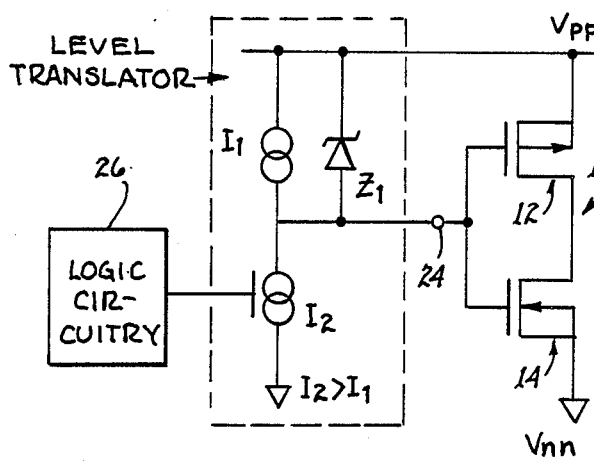
FIG. 2 is a skeleton block diagram and schematic embodiment of a power driver circuit including a level translator according to the present invention.

The basic operation of the improved active level translation circuitry of this invention may be understood with reference to the schematic diagram of FIG. 2. The level translator portion of the circuitry surrounded by the dotted rectangle is functionally equivalent to a low voltage (e.g. 20 volts) constant current source $I_1$ in series with a high-voltage (e.g. 400 volts) gated constant current source $I_2$. A voltage limiting device such as zener diode $Z_1$ having a breakdown voltage (e.g. 14 volts) less than the breakdown voltage of the low-voltage constant current source $I_1$ may be used to limit the voltage excursion between the gate and the source of the P-channel MOS transistor 12 comprising the pull-up device of the output driver 10.

The magnitude of the lower positioned constant current source $I_2$ is greater than the magnitude of the upper positioned constant current source $I_1$. When $I_2$ is gated off, the charge on the load capacitance (gate and Miller capacitances of the P-channel output driver transistor 12) will be discharged by the upper positioned constant current source $I_1$ and thus will return the voltage on output node 24 of the level translator to $V_{pp}$. When the bottom positioned constant current source $I_2$ is gated on, the condition $I_2 > I_1$ will result in a pulldown of the voltage on the translator output node 24 until the zener voltage is reached. The output thus pulls down about 14 V below $V_{pp}$. Thus a logic level signal from Logic Circuitry 26 to the lower gated constant current source $I_2$ can generate a high-voltage reference signal of about 14 V amplitude providing a differential output signal having a magnitude much less than the differences between the supply voltages $V_{pp}$ and $V_{nn}$.

Figure 3:
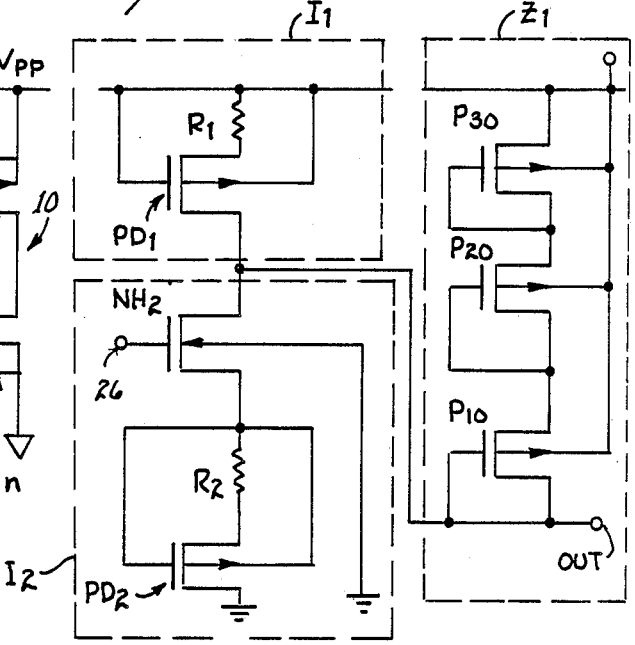
FIG. 3 is a detailed schematic of a preferred embodiment of the level translator portion of the circuitry of FIG. 2.

FIG. 3 shows CMOS circuitry for the implementation of the schematic level translator of FIG. 2. The constant current sources $I_1$ and $I_2$ comprise P-channel depletion mode transistors $PD_1$ and $PD_2$ respectively. Transistors $PD_1$ and $PD_2$ have source feedback resistors $R_1$ and $R_2$, respectively. The current ratio $I_1/I_2$ of the top to bottom current sources is controlled by the transistor geometry and the source feedback resistors $R_1$ and $R_2$. For proper operation, this ratio must be less than one. In practice, a nominal value of $I_1/I_2$ of about 0.6 has been found suitable to ensure that the ratio never reaches one. Both depletion transistors of the top and bottom constant current sources are preferably designed with identical operating points to maintain a tight distribution of the current $I_1/I_2$. Such tracking constant current source design eliminates possible circuit malfunction caused by unity or greater current ratio. The source feedback resistors $R_1$ and $R_2$ reduce the effect of process parameter variation on the current ratio.

High voltage N-channel enhancement mode MOS transistor $NH_2$ in FIG. 3 is driven by the logic level circuitry (not shown in FIG. 3) connected to the terminal that is connected to the gate of the transistor $NH_2$. When the $NH_2$ transistor is off, the current through the upper positioned current source $I_1$ comprising $PD_1$ returns the output voltage to $V_{pp}$. When the $NH_2$ transistor is turned on, its current rises to the current $I_2$ of the lower positioned current source $I_2$ provided by transistor $PD_2$. Since this is more current than can be provided by the current source $I_1$ comprising $PD_1$, current will flow through the serially-connected enhancement mode P-channel transistors $P_{10}$, $P_{20}$ and $P_{30}$ which together operate or function like the zener diode $Z_1$ of FIG. 2. Since these three P-channel MOS transistors 10, 20 and 30 each have a drain shorted to the gate, a voltage equal to about three times the threshold voltage is generated at the output terminal OUT. This voltage may be, for example, about 14 V below $V_{pp}$ and is sufficient to drive the top MOS transistor 12 in the output driver 10 of FIG. 1 or FIG. 2. The foregoing assumes that the breakdown voltage of $PD_1$ is greater than the serial combination of $P_{10}$, $P_{20}$ and $P_{30}$. Alternatively, the breakdown voltage of $PD_1$ could be controlled at the desired differential output voltage level.

Figure 4:
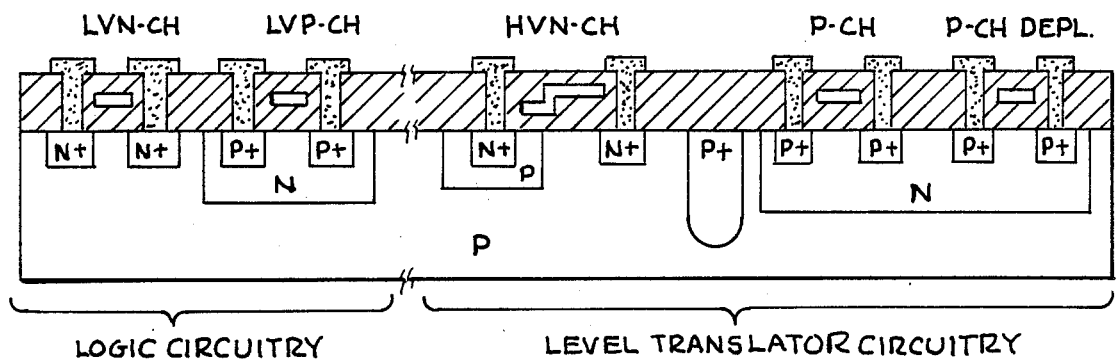
FIG. 4 is a cross-sectional view of the integrated circuit architecture or structure suitable for the integration of the level translation circuit of FIG. 3.

Referring now to FIG. 4, the architecture or structure of a monolithic silicon CMOS integrated circuit suitable for appropriate interconnection and for the implementation of the high voltage level translator of FIG. 3 is shown. The integrated circuit comprises a low-voltage (e.g. 36 volt) CMOS (logic circuitry) section located on the left side of this figure including a low voltage MOS N-channel (LV N-CH) and a low voltage MOS P-channel (LV P-CH) pair of MOS transistors in the logic circuitry section. The technology uses preferably conventional PN junction isolated N-well CMOS integration.

The level translator circuitry itself located on the right side of this 400 volt pseudo push-pull junction-isolated high voltage CMOS technology includes a high voltage MOS N-channel transistor (HV N-CH) and low voltage P-channel transistors (P-CH and P-CH DEPL). The 400 volt high voltage N-channel transistor H V N-CH is a lateral DMOS type of device well known to those skilled in the art. The logic and level translator circuit devices of FIG. 4 are all incorporated in a single high-sensitivity P-type substrate. Because of the design of the high voltage level translator circuit described in detail hereinbefore, a high voltage P-channel transistor is not required, substantially simplifying the monolithic integrated embodiment depicted in FIG. 4. Relating FIG. 4 to FIG. 3, $PD_1$ and $PD_2$ each comprised P-CH DEPL transistors (only one of the two are shown in FIG. 4). Transistor, $NH_2$ is the HV N-CH transistor, and $P_{10}$, $P_{20}$ and $P_{30}$ each comprise a P-CH transistor (only one of the three is shown in FIG. 4) in the level translation circuitry of FIG. 4.

There are, however, two factors which could substantially limit the maximum operating voltage of the high voltage CMOS circuitry of the level translator section of the integrated circuit of FIG. 4. These are vertical punch-through of the N-type well containing both P-CH and P-CH DEPL devices, and high-voltage CMOS latch-up. In the architecture of FIG. 4, vertical N-well punch-through is precluded by using a double N-well concept. A 10 micron deep relatively lightly doped N-well is used for the (logic circuitry) low-voltage p-channel transistor (LV P-CH) device, while a 15 micron relatively heavily-doped N-well is used for the level-translator portion to achieve the requisite punch-through voltage of the 400 volt pseudo CMOS level-translator section. By using a single high resistivity P-type substrate (e.g. 50 ohm-cm) both breakdown voltage and the punch-through voltage of the N-well containing both P-CH and P-CH DEPL are above 500 volts.

High voltage latch-up is prevented in two ways. First, the vertical parasitic PNP bi-polar gain is minimized by the relatively heavy doping of the 15 micron N-well in the high-voltage level translator section. The 15 micron well results in a large PNP base width. The high well doping also reduces the emitter injection efficiency. Both of these result in a low PNP bipolar gain. Second, the lateral NPN bipolar gain is degraded or reduced by the provision of a relatively deep, relatively heavily-doped P+ region that is located between the high-voltage N-channel (H V N-CH) transistor and the low voltage P-channel transistors P-CH and P-CH DEPL in the level translation portion of the integrated circuit. This P+ deep diffusion, which may have a depth of about 20 microns, greatly reduces the NPN gain. By using both the heavily-doped N-well and the deep P+ diffusion, the product of the NPN and the PNP current gains has been reduced to significantly less than one.

While the high-voltage level translator of the present invention has been particularly described and shown with reference to the preferred embodiments thereof, it will be understood by those skilled in the art that various changes in form and detail and omissions may be made therein without departing from the spirit and scope of the invention.

What is claimed is:

1. A level translation circuit for providing a low differential output voltage referenced to a high supply voltage in response to a low-voltage driving signal, where both said low-voltage driving signal and said low differential output voltage are less than said high supply voltage, comprising, in combination:
    first gated current source means coupled to said low voltage driving signal and having a breakdown voltage at least equal to said high supply voltage for switching current between a first current level and a second current level higher than said first current level; and
    second current source means serially coupled between said first gated current source means and said high supply voltage for establishing said low differential output voltage, said second current source means establishing a third current level less than said second current level of said first gated current source means wherein said first gated current source means and said second current source means each comprise a P-channel depletion mode MOS transistor having a gate connected to a source thereof.

2. The level translation circuit according to claim 1, wherein said first gated current source means further comprises an N-channel enhancement mode MOS transistor.

3. The level translation circuit according to claim 2, wherein said N-channel enhancement mode MOS transistor has a breakdown at least substantially equal to said high supply voltage.

4. The level translation circuit according to claim 1, further including voltage-limiting means coupled across said second current source means for establishing said low differential output voltage.

5. The level translation circuit of claim 1, wherein said first gated current source means and said second current source means comprise a junction-isolated CMOS integrated circuit.

6. A level translation circuit, comprising, in combination:
    a first terminal means for coupling said circuit with a first supply voltage;
    a second terminal means for coupling said circuit with a second supply voltage;
    first gated current source means coupled to said second terminal means for establishing a first current level;
    second current source means coupled to said first gated current source means and said first terminal means for establishing a second current level less than said first current level;
    input terminal means for providing a gating signal to said first gated current source means; and
    output terminal means coupled to said first gated current source means and said second current source means for providing an output signal referenced to said first supply voltage wherein said first gated current means and said second current source means each comprise a P-channel depletion mode MOS transistor having a gate connected to a source thereof.

7. The circuit according to claim 6, further including voltage limiting means coupled across said second current source means for establishing the value of said output signal.

8. A method for providing a low differential output voltage referenced to a high supply voltage in response to a low-voltage driving signal, wherein both said low-voltage driving signal and said low differential output voltage are less than said high supply voltage, comprising the steps of:
    providing a first gated current source means coupled to said low voltage driving signal and having a breakdown voltage at least equal to said high supply voltage for switching current between a first current level and a second current level higher than said first current level; and
    providing a second current source means serially coupled between said first gated current source means and said high supply voltage for establishing said low differential output voltage, said second current source means establishing a third current level less than said second current level of said first gated current source means wherein said first gated current source means and said second current source means each comprise a P-channel depletion mode MOS transistor having a gate connected to a source thereof.

* * * * *